(12) United States Patent
Choi et al.

(10) Patent No.: US 12,424,572 B2
(45) Date of Patent: Sep. 23, 2025

(54) SEMICONDUCTOR DEVICE (71) Applicant: Samsung Electronics Co., Ltd., Suwon-si (KR)

(72) Inventors: Ju-Il Choi, Seongnam-si (KR); Kwangjin Moon, Hwaseong-si (KR); Sujeong Park, Hwaseong-si (KR); JuBin Seo, Seongnam-si (KR); Jin Ho An, Seoul (KR); Dong-Chan Lim, Hwaseong-si (KR); Atsushi Fujisaki, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 409 days.

(21) Appl. No.: 18/168,038

(22) Filed: Feb. 13, 2023

(65) Prior Publication Data

US 2023/0187393 A1 Jun. 15, 2023

Related U.S. Application Data

(63) Continuation of application No. 17/229,023, filed on Apr. 13, 2021, now Pat. No. 11,581,279, which is a continuation of application No. 16/244,304, filed on Jan. 10, 2019, now Pat. No. 11,004,814.

(30) Foreign Application Priority Data

Jun. 15, 2018 (KR) .......................... 10-2018-0069195

(51) Int. Cl.
*H01L 23/00* (2006.01)
(52) U.S. Cl.
CPC .............. *H01L 24/05* (2013.01); *H01L 24/03* (2013.01); *H01L 24/06* (2013.01); *H01L 24/16* (2013.01);

(Continued)

(58) Field of Classification Search
CPC ...................................................... H01L 23/00
See application file for complete search history.

(56) References Cited

U.S. PATENT DOCUMENTS

| 6,424,036 B1 | 7/2002 | Okada |
| 8,232,655 B2 | 7/2012 | Arvin et al. |
| 8,659,155 B2 | 2/2014 | Cheng et al. |
| 8,937,009 B2 | 1/2015 | Daubenspeck et al. |

(Continued)

FOREIGN PATENT DOCUMENTS

| CN | 104637915 A | 5/2015 |
| JP | 2017-073520 A | 4/2017 |
| KR | 2012-0011768 A | 2/2012 |

OTHER PUBLICATIONS

Office Action for Chinese Application No. 20190508897.1 dated Feb. 18, 2025.

*Primary Examiner* — Marvin Payen
(74) *Attorney, Agent, or Firm* — Fish & Richardson P.C.

(57) ABSTRACT

Disclosed is a semiconductor device including a conductive pattern on a substrate, a passivation layer on the substrate and including an opening that partially exposes the conductive pattern, and a pad structure in the opening of the passivation layer and connected to the conductive pattern. The pad structure includes a first metal layer that fills the opening of the passivation layer and has a width greater than that of the opening, and a second metal layer on the first metal layer. The first metal layer has a first thickness at an outer wall of the first metal layer, a second thickness on a top surface of the passivation layer, and a third thickness on a top surface of the conductive pattern. The second thickness is greater than the first thickness, and the third thickness is greater than the second thickness.

20 Claims, 10 Drawing Sheets (52) U.S. Cl.
CPC .... *H01L 24/17* (2013.01); *H01L 2224/02372* (2013.01); *H01L 2224/03462* (2013.01); *H01L 2224/03825* (2013.01); *H01L 2224/03914* (2013.01); *H01L 2224/0401* (2013.01); *H01L 2224/05015* (2013.01); *H01L 2224/05017* (2013.01); *H01L 2224/05018* (2013.01); *H01L 2224/05019* (2013.01); *H01L 2224/05027* (2013.01); *H01L 2224/05082* (2013.01); *H01L 2224/05564* (2013.01); *H01L 2224/05573* (2013.01); *H01L 2224/05644* (2013.01); *H01L 2224/05647* (2013.01); *H01L 2224/05655* (2013.01); *H01L 2224/06136* (2013.01); *H01L 2224/06182* (2013.01); *H01L 2224/16145* (2013.01); *H01L 2224/16227* (2013.01); *H01L 2224/17181* (2013.01)

(56) References Cited

U.S. PATENT DOCUMENTS

| | | |
|---|---|---|
| 9,230,934 B2 | 1/2016 | Lin et al. |
| 9,911,708 B2 | 3/2018 | Arvin et al. |
| 9,997,450 B2 | 6/2018 | Oi et al. |
| 2001/0054768 A1 | 12/2001 | Kim |
| 2011/0101523 A1 | 5/2011 | Hwang et al. |
| 2011/0193220 A1 | 8/2011 | Kuo et al. |
| 2012/0007230 A1 | 1/2012 | Hwang et al. |
| 2015/0123278 A1 | 5/2015 | Park et al. |
| 2016/0111384 A1 | 4/2016 | Tseng et al. |
| 2016/0190077 A1 | 6/2016 | Ho et al. |
| 2016/0307842 A1 | 10/2016 | Baek et al. |
| 2016/0307862 A1 | 10/2016 | Lin et al. |
| 2016/0372430 A1 | 12/2016 | Arvin et al. |
| 2017/0345786 A1 | 11/2017 | Chen et al. |
| 2017/0355598 A1 | 12/2017 | Chou et al. |

SEMICONDUCTOR DEVICE

CROSS-REFERENCE TO RELATED APPLICATION

This is a continuation of U.S. application Ser. No. 17/229,023, filed Apr. 13, 2021, which is a continuation of U.S. application Ser. No. 16/244,304, filed Jan. 10, 2019 which is a U.S. nonprovisional application claims priority under 35 U.S.C § 119 to Korean Patent Application No. 10-2018-0069195 filed on Jun. 15, 2018 in the Korean Intellectual Property Office, the entire contents of each of which are hereby incorporated by reference.

BACKGROUND

The present example embodiments relate to a semiconductor device, and more particularly, to a semiconductor device including a fine pad structure.

A trend toward compact size requires semiconductor devices to have connection terminals arranged at fine pitches. Semiconductor devices may have electrical connection structures such as solder balls or solder bumps for electrical connections with other semiconductor devices or printed circuit boards.

SUMMARY

Some example embodiments of the present inventive concepts provide a semiconductor device having a pad structure connected to an external electronic device.

The object of the present inventive concepts is not limited to that which is mentioned above, and other objects which have not been mentioned above will be clearly understood to those skilled in the art from the following description.

According to some example embodiments of the present inventive concepts, a semiconductor device may include a conductive layer, a passivation layer and a pad structure. The conductive pattern may be on a substrate. The passivation layer may be on the substrate and include an opening that partially exposes the conductive pattern. The pad structure is in the opening of the passivation layer and connected to the conductive pattern. The pad structure may include a first metal layer that fills the opening of the passivation layer and has a width greater than a width of the opening and a second metal layer on the first metal layer. The first metal layer may have a first thickness at an outer wall of the first metal layer, a second thickness on a top surface of the passivation layer, and a third thickness on a top surface of the conductive pattern. The second thickness may be greater than the first thickness. The third thickness may be greater than the second thickness.

According to some example embodiments of the present inventive concepts, a semiconductor device may include a conductive pattern a passivation layer and a pad structure. The conductive pattern is on a substrate. The passivation layer is on the substrate and includes an opening that partially exposes the conductive pattern. The pad structure is in the opening of the passivation layer and is connected to the conductive pattern. The pad structure may include a first metal layer that fills the opening of the passivation layer and a second metal layer on the first metal layer. The first metal layer may include a central part in and above the opening of the passivation layer; and an edge part on the passivation layer. A top surface of the first metal layer may be located at a level higher than a level of a top surface of the passivation layer. The edge part of the first metal layer may have an upwardly convex top surface.

According to some example embodiments of the present inventive concepts, a semiconductor device may include a conductive pattern, a passivation layer, and a pad structure. The conductive pattern is on a substrate. The passivation layer is on the substrate and includes an opening that partially exposes the conductive pattern. The pad structure is in the opening of the passivation layer and connected to the conductive pattern. The pad structure may include a first metal layer that fills the opening of the passivation layer and a second metal layer on the first metal layer. The first metal layer may include a central part in the opening and an edge part on the passivation layer. The first metal layer may have a top surface at a level higher than a level of a top surface of the passivation layer. The top surface of the first metal layer may have a first curvature at the edge part and a second curvature at the central part. The second curvature may be different from the first curvature.

Details of other example embodiments are included in the description and drawings.

DETAILED DESCRIPTION OF EMBODIMENTS

It will be hereinafter discussed a semiconductor device according to some example embodiments of the present inventive concepts in conjunction with the accompanying drawings.

When the terms "about" or "substantially" are used in this specification in connection with a numerical value, it is intended that the associated numerical value include a tolerance of ±10% around the stated numerical value. The expression "up to" includes amounts of zero to the expressed upper limit and all values there between. When ranges are specified, the range includes all values there between such as increments of 0.1%. Moreover, when the words "generally" and "substantially" are used in connection with geometric shapes, it is intended that precision of the geometric shape is not required but that latitude for the shape is within the scope of the disclosure.

Figure 1A:
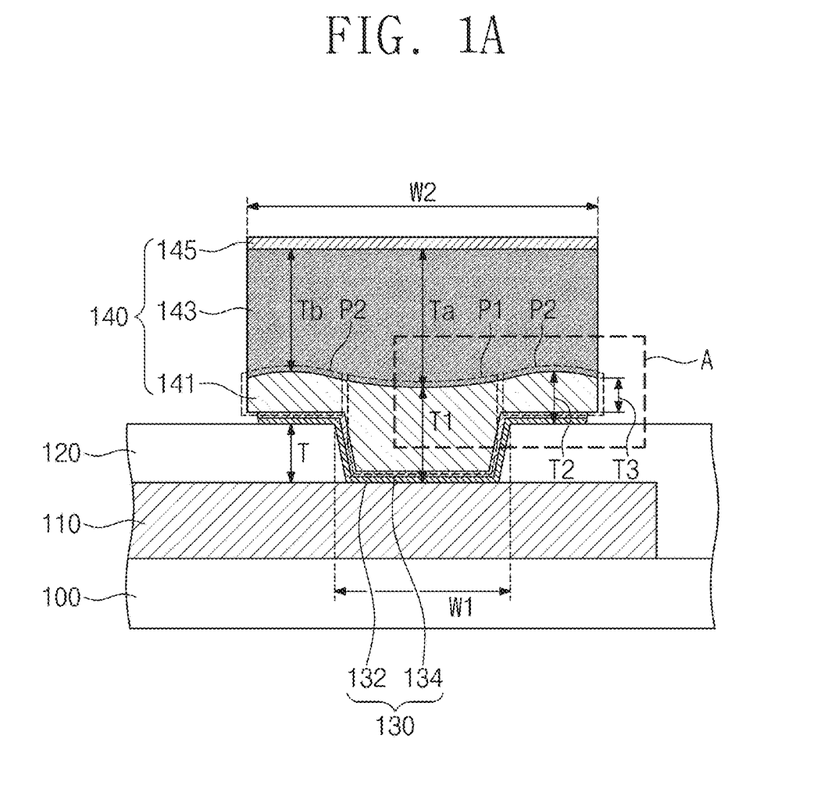
FIG. 1A illustrates a cross-sectional view partially showing a semiconductor device according to some example embodiments of the present inventive concepts.
Figure 1B:
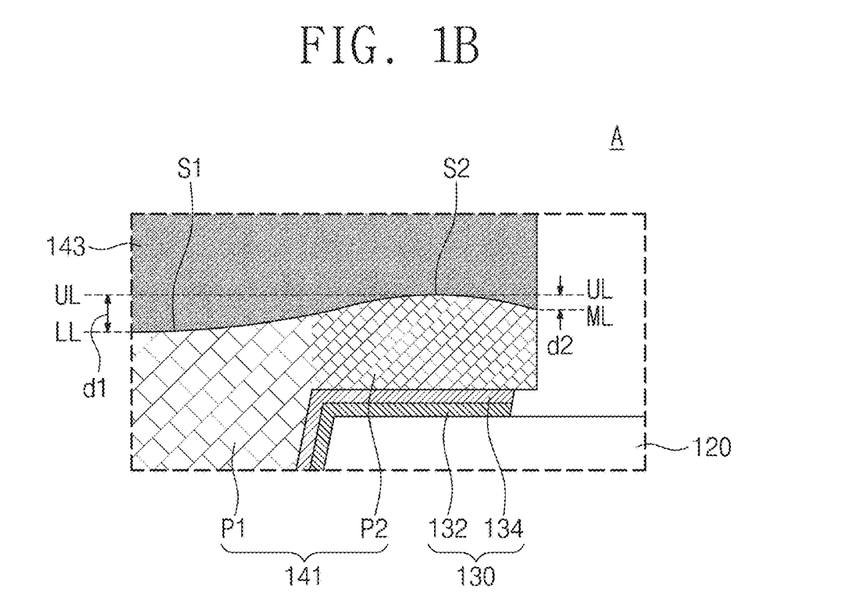
FIG. 1B illustrates an enlarged view showing section A of FIG. 1A.

FIG. 1A illustrates a cross-sectional view partially showing a semiconductor device according to some example embodiments of the present inventive concepts. FIG. 1B illustrates an enlarged view showing section A of FIG. 1A.

Referring to FIGS. 1A and 1B, a semiconductor device may include a conductive pattern 110 on a lower structure 100, a passivation layer 120 covering the conductive pattern 110, and a pad structure 140 on the passivation layer 120 and connected to the conductive pattern 110.

The lower structure 100 may include semiconductor integrated circuits on a semiconductor substrate, electrical lines, and dielectric layers covering the semiconductor integrated circuits and the electrical lines.

The conductive pattern 110 may be disposed on an uppermost dielectric layer covering the semiconductor integrated circuits. The conductive pattern 110 may include, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or an alloy thereof. The conductive pattern 110 may include a barrier layer, a seed layer, and a metal layer that are sequentially stacked.

On the lower structure 100, the passivation layer 120 may cover the conductive pattern 110 and have an opening that partially exposes the conductive pattern 110. A thickness T of the passivation layer 120 may be greater on a top surface of the lower structure 100 than on a top surface of the conductive pattern 110. Alternatively, the passivation layer 120 may have a substantially uniform thickness on the lower structure 100 and the conductive pattern 110.

The passivation layer 120 may include, for example, an inorganic dielectric layer such as a silicon oxide layer, a silicon nitride layer, and a silicon oxynitride layer, or a polyimide-based dielectric layer such as a photo sensitive polyimide (PSPI) layer.

The pad structure 140 may be disposed on the passivation layer 120, while filling the opening. The pad structure 140 may be electrically connected to the conductive pattern 110. The pad structure 140 may have a greatest width W2 greater than a greatest width W1 of the opening.

A lower metal pattern 130 may be disposed between the pad structure 140 and the conductive pattern 110. The lower metal pattern 130 may have a substantially uniform thickness. The lower metal pattern 130 may cover a top surface of the conductive pattern 110, which top surface is exposed to the opening, and also cover a sidewall of the opening and a top surface of the passivation layer 120. The lower metal pattern 130 may include a metal barrier pattern 132 and a metal seed pattern 134 that are sequentially stacked. For example, the metal barrier pattern 132 may include titanium, titanium nitride, tantalum, tantalum nitride, ruthenium, cobalt, manganese, tungsten nitride, nickel, or nickel boride. For another example, the metal barrier pattern 132 may include a double layer consisting of titanium and titanium nitride or a mixture layer other than the double layer. The metal seed pattern 134 may include, for example, copper (Cu).

The pad structure 140 may have a sidewall vertically misaligned with that of the lower metal pattern 130, and an undercut may be defined between the top surface of the passivation layer 120 and a bottom surface of the pad structure 140.

In some example embodiments, the pad structure 140 may include a first metal layer 141, a second metal layer 143, and a capping metal layer 145 that are sequentially stacked on the lower metal pattern 130. The pad structure 140 may fill the opening of the passivation layer 120, and may have a substantially planar top surface.

The first metal layer 141 may fill the opening of the passivation layer 120, and may have a top surface at a level higher than that of the top surface of the passivation layer 120. For example, the first metal layer 141 may have a non-planar top surface. The first metal layer 141 may have a second width W2 greater than the first width W1 of the opening of the passivation layer 120.

The first metal layer 141 may include a central part P1 disposed in and above the opening of the passivation layer 120 and an edge part P2 disposed on the top surface of the passivation layer 120. The first metal layer 141 may have a substantially pillar shape, and the edge part P2 may surround the central part P1.

The first metal layer 141 may include a first metallic material, for example, copper (Cu) or a copper alloy. In this description, the copper alloy may mean copper mixed with an extremely small amount of one or more of C, Ag, Co, Ta, In, Sn, Zn, Mn, Ti, Mg, Cr, Ge, Sr, Pt, Mg, Al, and Zr.

The first metal layer 141 may have different grain sizes at the central and edge parts P1 and P2. In some example embodiments, the first metal layer 141 may have a smaller average grain size at the edge part P2 than at the central part P1.

The first metal layer 141 may have a first thickness T1 at the central part P1 and a second thickness T2 at the edge part P2. The first thickness T1 is a minimum thickness of the central part P1. The second thickness T2 is a maximum thickness of the edge part P2. The first thickness T1 may be greater than the thickness T of the passivation layer 120 on the conductive pattern 110, and the second thickness T2 may be less than the thickness T of the passivation layer 120 on the conductive pattern 110. The second thickness T2 of the first metal layer 141 at the edge part P2 may be less than the first thickness T1 of the first metal layer 141 at the central part P1. The first metal layer 141 may further have a third thickness T3 at an outer wall, which third thickness T3 is less than the second thickness T2. For example, the first metal layer 141 may have a thickness ranging from about 1.0 to 1.5 μm at the edge part P2 and about 3.0 to 5.0 μm at the central part P1.

The central part P1 of the first metal layer 141 may have top surface S1 that is downwardly convex, and the edge part P2 of the first metal layer 141 may have a top surface S2 that is upwardly convex. For example, the first metal layer 141 may have a difference in level between the top surface S1 at the central part P1 and the top surface S2 at the edge part P2. The top surface S1 at the central part P1 and the top surface S2 at the edge part P2 may be curved in opposite directions to each other. The top surface S1 at the central part P1 of the first metal layer 141 may have a first curvature, and the top surface S2 at the edge part P2 of the first metal layer 141 may have a second curvature different from the first curvature. The second curvature may be greater than the first curvature.

In some example embodiments, the top surface of the first metal layer 141 may have a top level UL at the edge part P2 and a bottom level LL at the central part P1. A difference d1 between the top and bottom levels UL and LL of the top surface of the first metal layer 141 may be less than the thickness T of the passivation layer 120 on the conductive pattern 110. The first metal layer 141 may have a middle level ML at the outer wall thereof, which middle level ML is located between the top and bottom levels UL and LL, and thus the top surface of the first metal layer 141 may have the middle level ML at the edge part P2. A difference d2 between the middle and top levels ML and UL may be less than the difference d1 between the top and bottom levels UL and LL.

The second metal layer 143 may have a bottom surface in contact with the top surface of the first metal layer 141. In such cases, the second metal layer 143 may have a non-planar bottom surface. The second metal layer 143 may have a substantially planar top surface. For example, the top surface of the second metal layer 143 may be more planar than the top surface of the first metal layer 141.

The second metal layer 143 may include a second metallic material different from the first metallic material of the first metal layer 141. The second metal layer 143 may include, for example, nickel (Ni).

The second metal layer 143 may have a fourth thickness Ta, or a greatest thickness, on the central part P1 of the first metal layer 141 and a fifth thickness Tb, or a minimum thickness, on the edge part P2 of the first metal layer 141. The minimum thickness Tb of the second metal layer 143 may be greater than the first thickness T1 corresponding to a greatest thickness of the first metal layer 141. The second metal layer 143 may have a thickness ranging from about 3.0 to 4.0 μm.

The second metal layer 143 may have a third width W3 substantially the same as the second width W2 of the first metal layer 141. An outer wall of the second metal layer 143 may be vertically aligned with the outer wall of the first metal layer 141.

The capping metal layer 145 may be disposed on the top surface of the second metal layer 143, and may include a third metallic material different from the first and second metallic materials respectively of the first and second metal layers 141 and 143. The capping metal layer 145 may include, for example, gold (Au).

Figure 2:
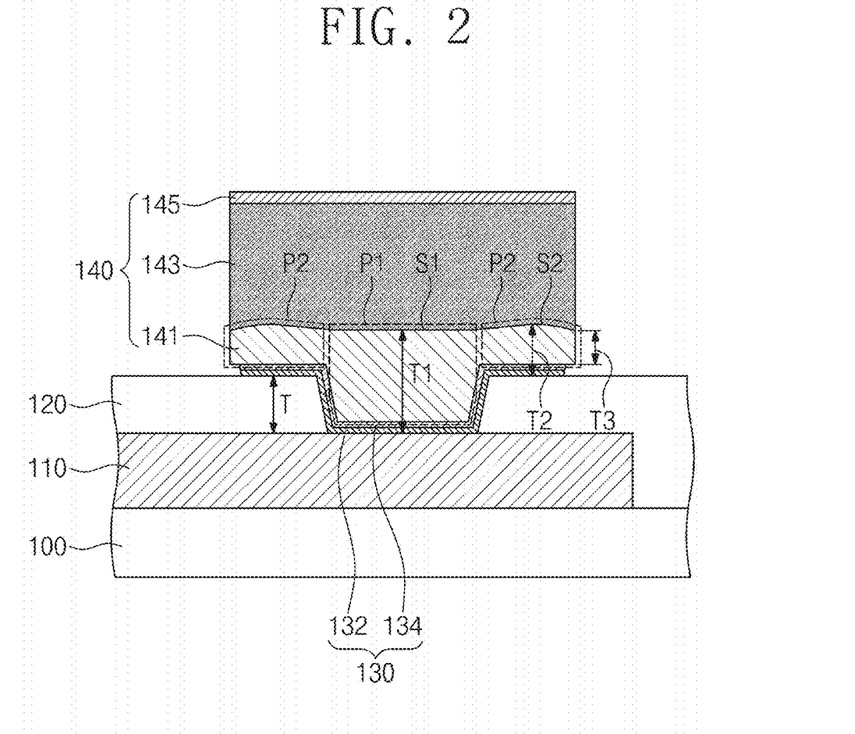
FIGS. 2 and 3 illustrate cross-sectional views partially showing a semiconductor device according to some example embodiments of the present inventive concepts.
Figure 3:
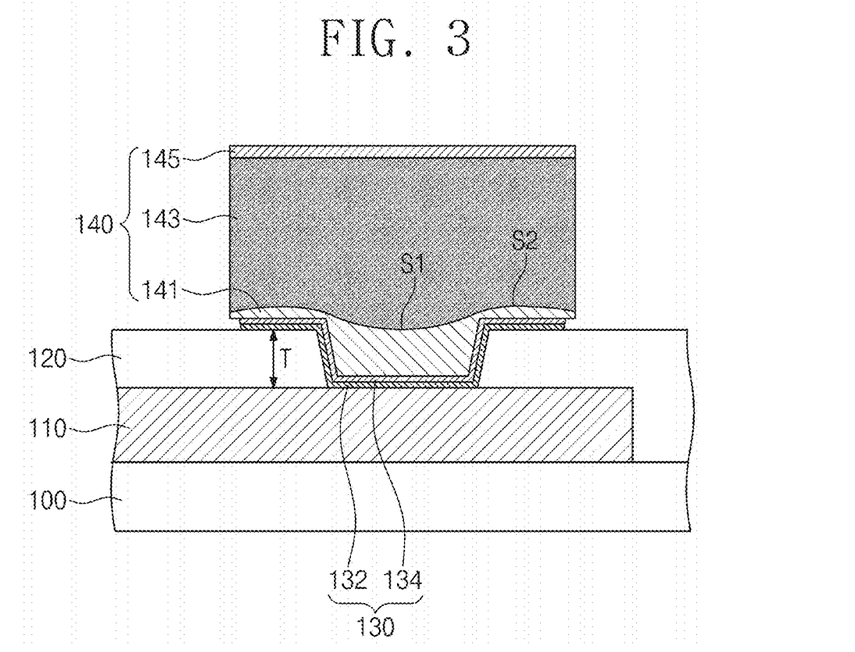

FIGS. 2 and 3 illustrate cross-sectional views partially showing a semiconductor device according to some example embodiments of the present inventive concepts. The same technical features as those of the embodiments discussed above with reference to FIGS. 1A and 1B may be omitted in the interest of brevity of description.

Referring to FIGS. 2 and 3, the pad structure 140 may include the first metal layer 141, the second metal layer 143, and the capping metal layer 145 that are sequentially stacked, and as discussed above, the first metal layer 141 may include the central part P1 provided in and above the opening of the passivation layer 120 and the edge part P2 disposed on the top surface of the passivation layer 120.

As shown in FIG. 2, the central part P1 of the first metal layer 141 may have a substantially planar top surface S1, and the edge part P2 of the first metal layer 141 may have an upwardly convex top surface S2, the upwardly convex top surface may be rounded. The third thickness T3 at the outer wall of the first metal layer 141 may be less than the second thickness T2 of the first metal layer 141 on the passivation layer 120.

As shown in FIG. 3, the top surface S1 at the central part P1 of the first metal layer 141 may be located at a level the same as or lower than that of the top surface of the passivation layer 120. The edge part P2 of the first metal layer 141 may extend onto the top surface of the passivation layer 120 from the first part P1 of the first metal layer 141.

Figure 4A:
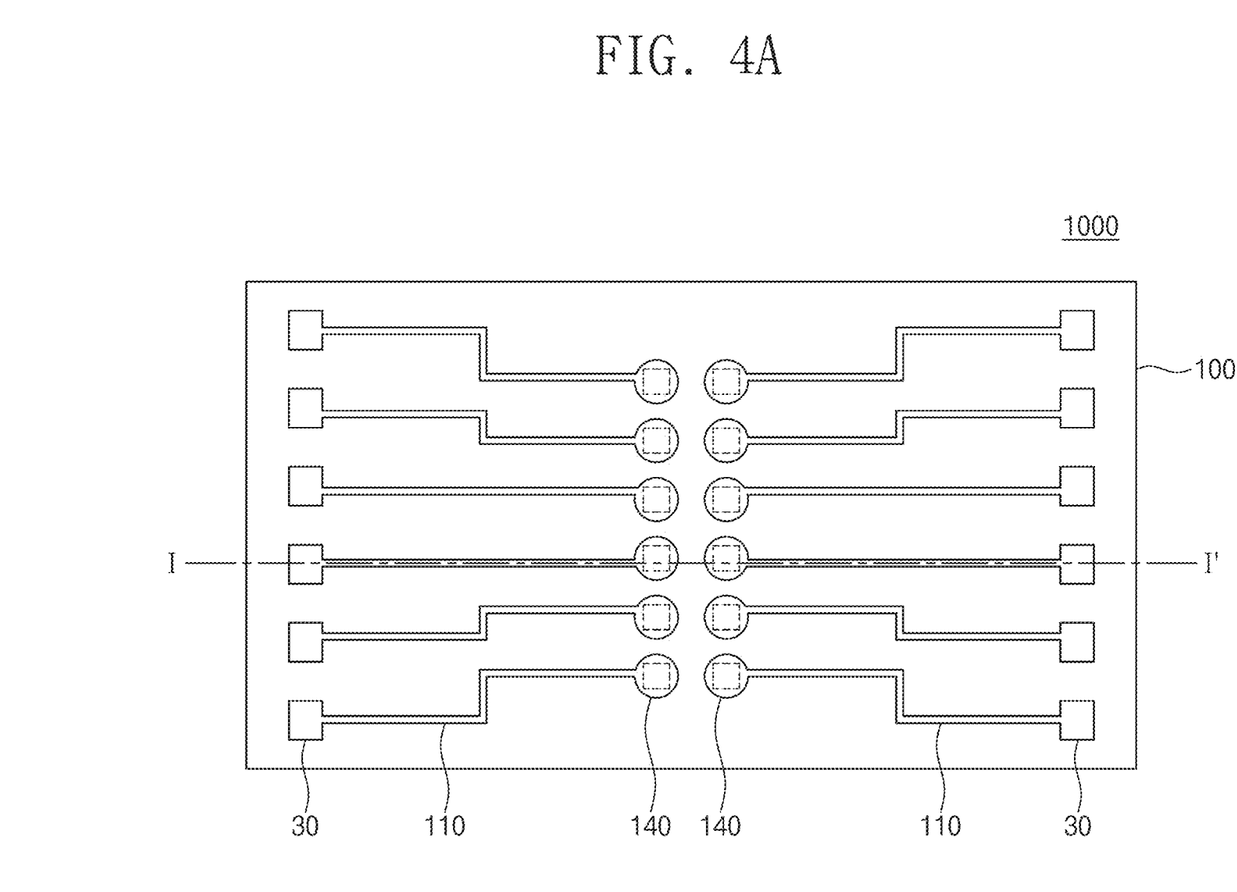
FIG. 4A illustrates a simplified plan view showing a semiconductor device according to some example embodiments of the present inventive concepts.
Figure 4B:
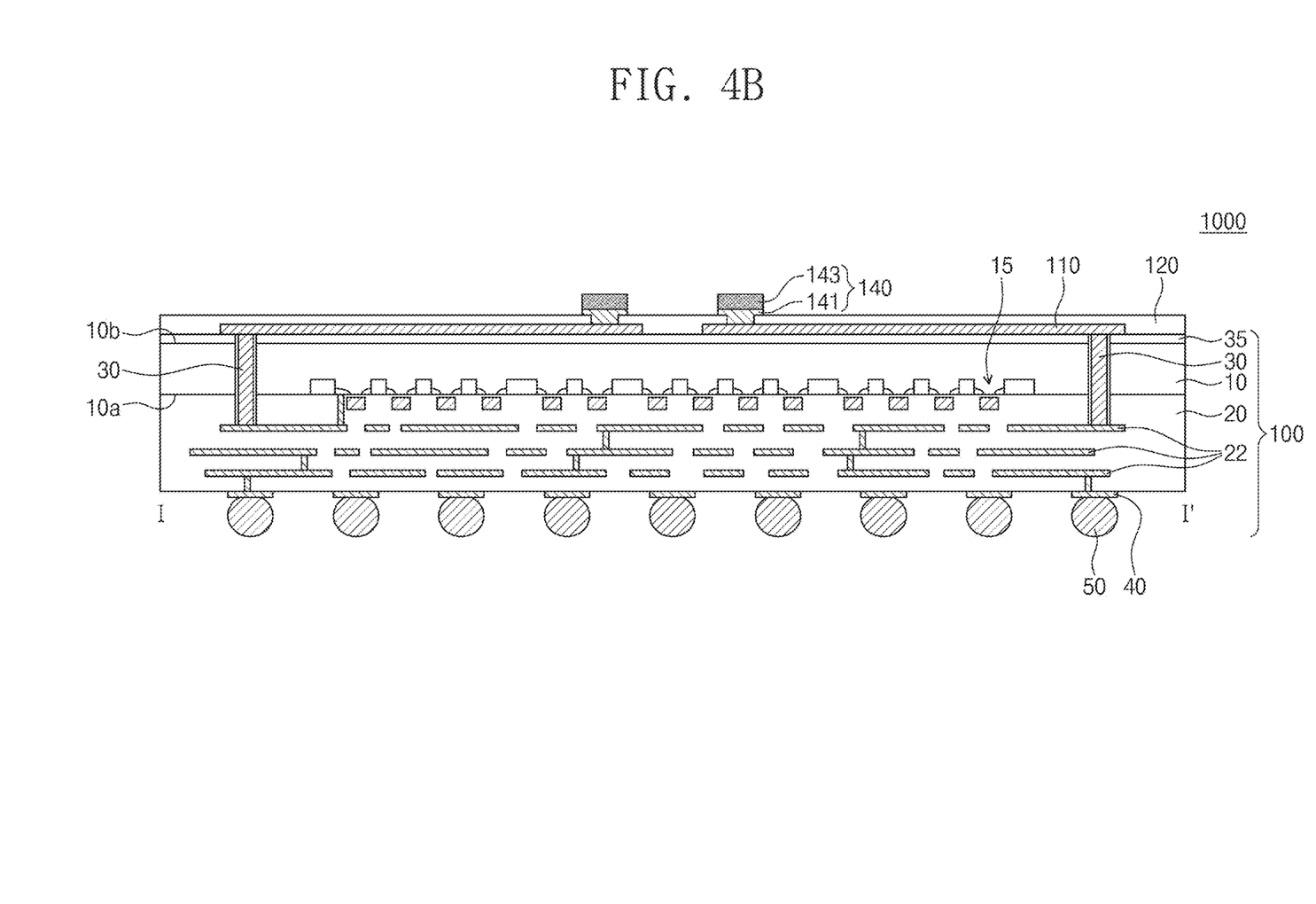
FIG. 4B illustrates a simplified cross-sectional view taken along line A-A' of FIG. 4A, showing a semiconductor device according to some example embodiments of the present inventive concepts.

FIG. 4A illustrates a simplified plan view showing a semiconductor device according to some example embodiments of the present inventive concepts. FIG. 4B illustrates a simplified cross-sectional view taken along line A-A' of FIG. 4A, showing a semiconductor device according to some example embodiments of the present inventive concepts.

Referring to FIGS. 4A and 4B, a semiconductor device 1000 may include a lower structure 100, redistribution metal patterns 110, a passivation layer 120, and pad structures 140. The lower structure 100 may include a semiconductor substrate 10, an interlayer dielectric layer 20, lower connection pads 40, and external connection terminals 50.

The semiconductor substrate 10 may have a first surface 10a and a second surface 10b facing each other. Semiconductor integrated circuits 15 may be disposed on the first surface 10a of the semiconductor substrate 10. The semiconductor integrated circuits 15 may include, for example, a memory component, a core circuit component, a peripheral circuit component, a logic circuit component, a control circuit component, or a combination thereof.

The first surface 10a of the semiconductor substrate 10 may be provided thereon with the interlayer dielectric layer 20 covering the semiconductor integrated circuits 15, and the interlayer dielectric layer 20 may be provided therein with internal electrical lines 22 that are electrically connected to the semiconductor integrated circuits 15. The interlayer dielectric layer 20 may have a single layer structure or a multiple layer structure.

The lower connection pads 40 may be arranged on a bottom surface of the semiconductor device 1000, and the external connection terminals 50 such as solder balls may be attached to the lower connection pads 40.

One or more dielectric layers 35 may be disposed on the second surface 10b of the semiconductor substrate 10, and the redistribution metal patterns 110 may be disposed on an uppermost one of the dielectric layers 35. The redistribution metal patterns 110 may include copper (Cu), aluminum (Al), tungsten (W), nickel (Ni), titanium (Ti), titanium nitride (TiN), tantalum (Ta), tantalum nitride (TaN), gold (Au), or a combination thereof.

The lower structure 100 may include through electrodes 30 that vertically penetrate the semiconductor substrate 10. The through electrodes 30 may have pillar shapes, and may electrically connect the internal electrical lines 22 provided on the first surface 10a of the semiconductor substrate 10 to the redistribution metal patterns 110 provided on the second surface 10b of the semiconductor substrate 10.

The passivation layer 120 may cover the redistribution metal patterns 110 on the second surface 10b of the semiconductor substrate 10. The passivation layer 120 may include, as discussed above, openings that partially expose conductive patterns, i.e., the redistribution metal patterns 110.

The pad structures 140 may be provided in the openings of the passivation layer 120. Each of the pad structures 140 may include a first metal layer 141 filling the opening of the passivation layer 120, and also include a second metal layer 143 on the first metal layer 141. The pad structures 140 may have substantially planar top surfaces.

Figure 5:
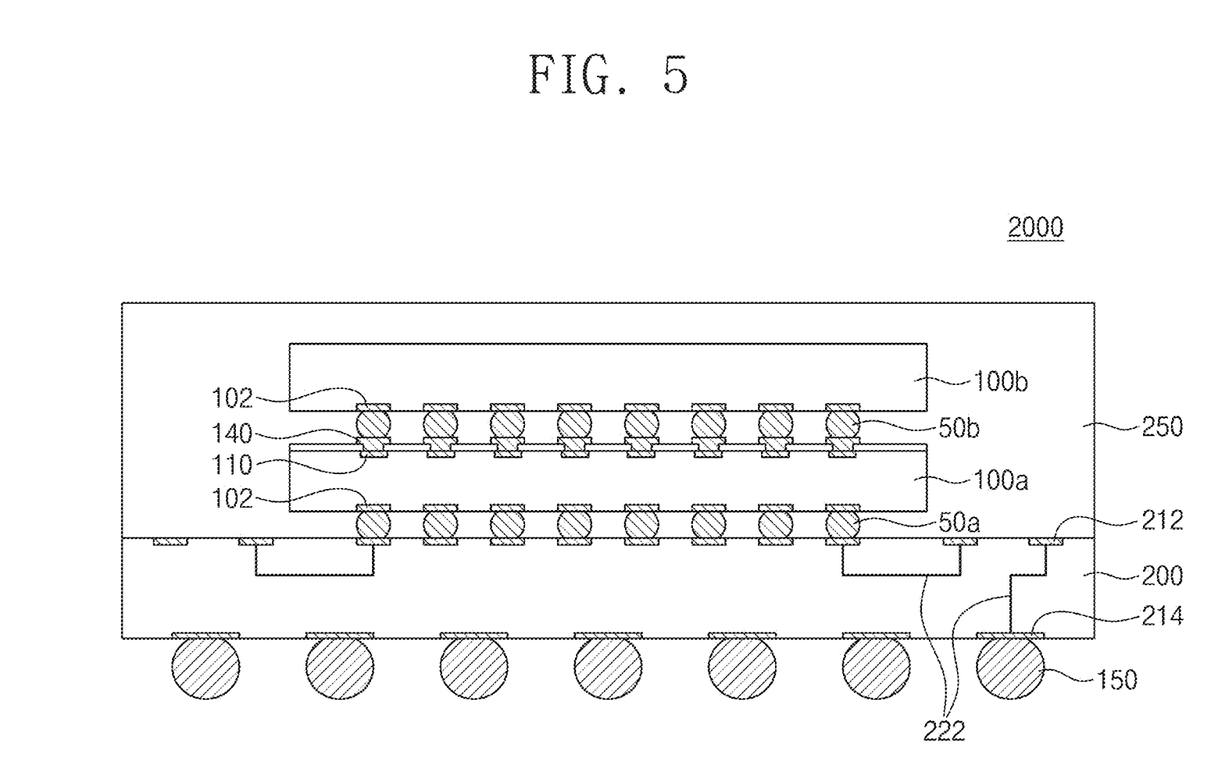
FIG. 5 illustrates a cross-sectional view showing a semiconductor package including a semiconductor device according to some example embodiments of the present inventive concepts.

FIG. 5 illustrates a cross-sectional view showing a semiconductor package including a semiconductor device according to some example embodiments of the present inventive concepts.

Referring to FIG. 5, a semiconductor package 2000 may include a package substrate 200, a first semiconductor chip 100a, a second semiconductor chip 100b, and a molding layer 250.

The package substrate 200 may include, for example, a printed circuit board, a flexible substrate, or a tape substrate. The package substrate 200 may be one of a flexible printed circuit board, a rigid printed circuit board, and a combination thereof, each of which boards includes internal electrical lines formed therein.

The package substrate 200 may have top and bottom surfaces facing each other, and may include bonding pads 212, external connection pads 214, and internal electrical lines 222. The bonding pads 212 may be arranged on the top surface of the package substrate 200, and the external connection pads 214 may be arranged on the bottom surface of the package substrate 200. The bonding pads 212 may be electrically connected through the internal electrical lines 222 to the external connection pads 214. External connection terminals 150 may be attached to the external connection pads 214. The external connection terminals 150 may be arranged to constitute a ball grid array (BGA).

The first and second semiconductor chips 100a and 100b may be stacked on the package substrate 200. One or more of the first and second semiconductor chips 100a and 100b may be a semiconductor device according to some embodiments of the present inventive concepts, and may be provided on its top and/or bottom surfaces with the pad structures 140 discussed above.

All of the first and second semiconductor chips 100a and 100b may be memory chips or non-memory chips. Alternatively, the first semiconductor chip 100a may be a non-memory chip, and the second semiconductor chip 100b may be a memory chip. The first and second semiconductor chips 100a and 100b may have the same size or different sizes.

The first semiconductor chip 100a may be flip-chip bonded to the package substrate 200. The first semiconductor chip 100a may be provided on its bottom surface with lower connection pads 102 and on its top surface with the pad structures 140 discussed above.

The lower connection pads 102 of the first semiconductor chip 100a may be coupled to the bonding pads 212 of the package substrate 200 through electrical connection terminals 50a such as conductive bumps or solder balls.

A passivation layer (not shown) may be provided on the first semiconductor chip 100a, and the pad structures 140 may be provided in openings of the passivation layer. The pad structures 140 may be electrically connected to the lower connection pads 102 through internal electrical lines and through electrodes in the first semiconductor chip 100a. As discussed above, each of the pad structures 140 may include a first metal layer filling the opening of the passivation layer, and also include a second metal layer on the first metal layer.

The second semiconductor chip 100b may have lower connection pads 102 on the bottom surface thereof, and may be connected to the pad structures 140 of the first semiconductor chip 100a through electrical connection terminals 50b such as conductive bumps or solder balls.

In some example embodiments, because the pad structures 140 of the first semiconductor chip 100a have the substantially planar top surfaces, contamination substances may be prevented from being left between the pad structures 140 and the connection terminals 50b when the connection terminals 50b, such as solder balls, are attached to the pad structures 140 of the first semiconductor chip 100a. As a result, structural and electrical reliability may be increased between the pad structures 140 and the connection terminals 50b.

<Fabrication Method>

The following will now describe a method of fabricating a semiconductor device according to some example embodiments of the present inventive concepts with reference to FIGS. 6 to 11. FIGS. 6 to 11 illustrate cross-sectional views showing a method of fabricating a semiconductor device according to some example embodiments of the present inventive concepts.

Figure 6:
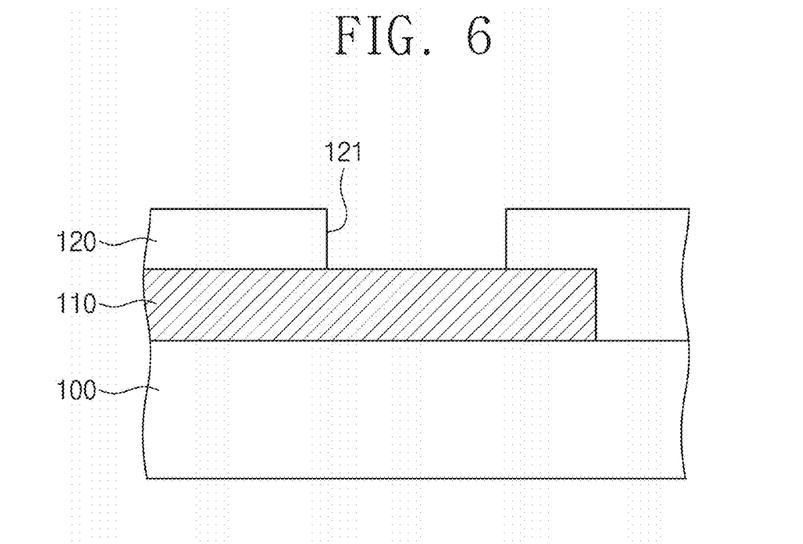
FIGS. 6 to 11 illustrate cross-sectional views showing a method of fabricating a semiconductor device according to some example embodiments of the present inventive concepts.

Referring to FIG. 6, a conductive pattern 110 may be formed on a lower structure 100. Although not shown, the lower structure 100 may include a semiconductor substrate, semiconductor integrated circuits on the semiconductor substrate that include a memory circuit, a logic circuit, or a combination thereof, and stacked dielectric layers that cover the semiconductor integrated circuits.

The conductive pattern 110 may be formed using a deposition process, a patterning process, an electroplating process, or an electroless plating process. The conductive pattern 110 may include, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or an alloy thereof.

A passivation layer 120 may be formed on the lower structure 100 and to have an opening 121 that partially exposes a top surface of the conductive pattern 110.

For example, when the passivation layer 120 is or includes a polyimide-based material such as photo sensitive polyimide (PSPI), a spin coating process may be performed to deposit the passivation layer 120, and without separately forming a photoresist layer, an exposure process may be performed to pattern the passivation layer 120 to form the opening 121 that partially exposes the conductive pattern 110.

For another example, the passivation layer 120 may be formed of a silicon oxide layer, a silicon nitride layer, or a silicon oxynitride layer. A mask pattern (not shown) may be formed on the passivation layer 120, and then partially etched to form the opening 121 that partially exposes the conductive pattern 110.

Figure 7:
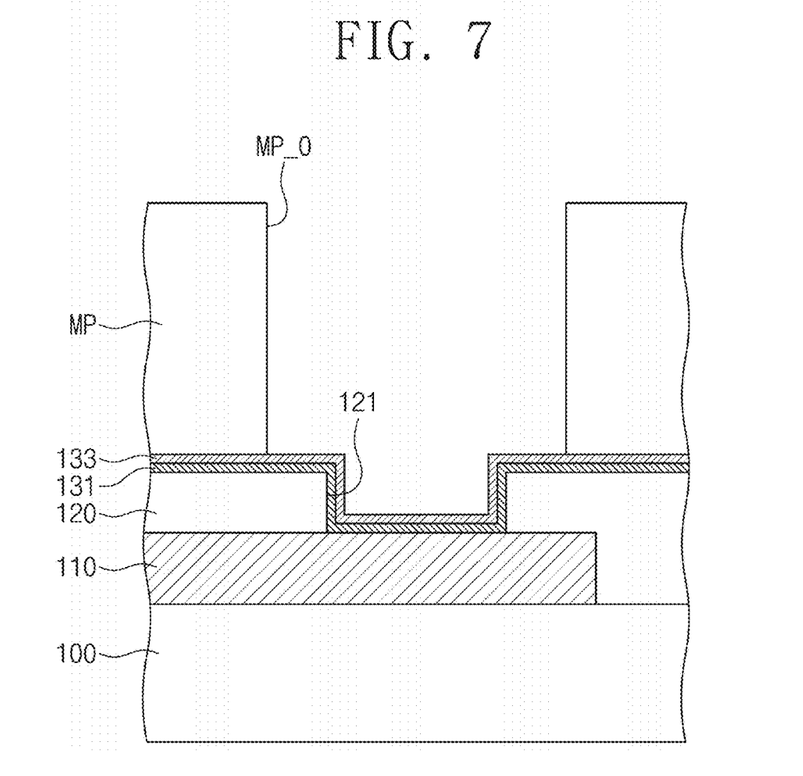

Referring to FIG. 7, a preliminary lower metal layer 131 and 133 may be conformally deposited on a surface of the passivation layer 120. The preliminary lower metal layer 131 and 133 may have a substantially uniform thickness on the top surface of the conductive pattern 110 and on the surface of the passivation layer 120.

The formation of the preliminary lower metal layer 131 and 133 may include sequentially depositing a metal barrier layer 131 and a metal seed layer 133. The metal barrier layer 131 and the metal seed layer 133 may be formed using physical vapor deposition (PVD), chemical vapor deposition (CVD), or atomic layer deposition (ALD). For example, the metal barrier layer 131 may include titanium, titanium nitride, tantalum, tantalum nitride, ruthenium, cobalt, manganese, tungsten nitride, nickel, or nickel boride. For another example, the metal barrier layer 131 may include a double layer consisting of titanium and titanium nitride or a mixture layer other than the double layer. The metal seed layer 133 may include, for example, copper (Cu).

A mask pattern MP having an opening MP_O may be formed on the preliminary lower metal layer 131 and 133. The opening MP_O of the mask pattern MP may be formed to correspond to the opening 121 of the passivation layer 120. The opening MP_O of the mask pattern MP may have a maximum width greater than that of the opening 121 of the passivation layer 120, and may partially expose a top surface of the passivation layer 120.

The formation of the mask pattern MP may include coating a photoresist layer (not shown), and using a photolithography process to pattern the photoresist layer.

Figure 8:
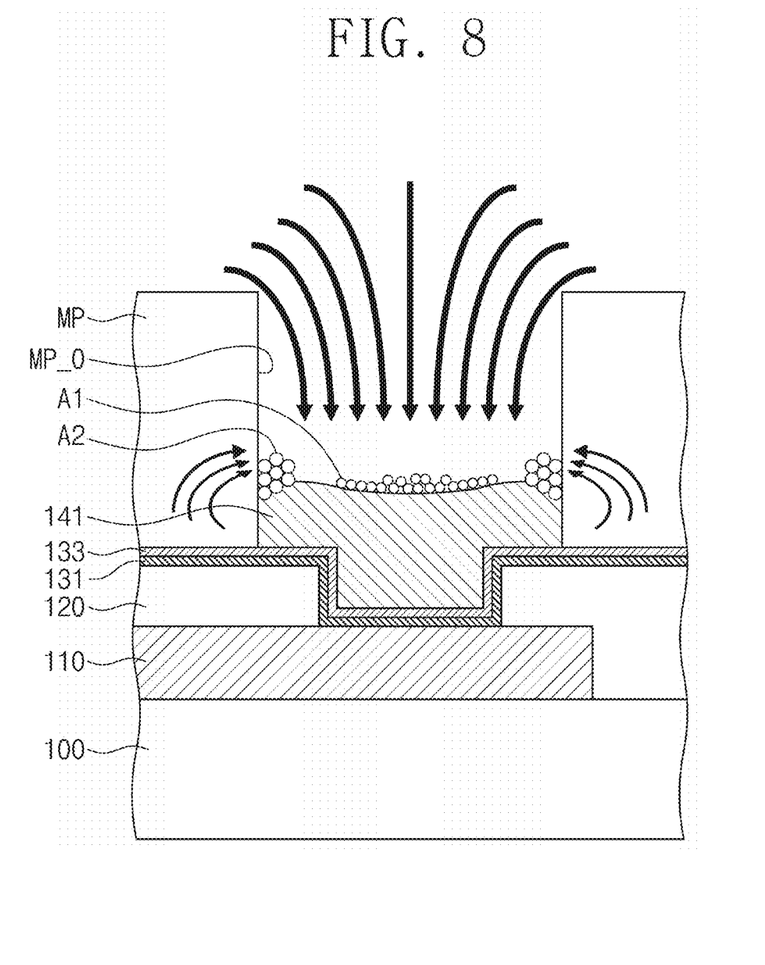

Referring to FIG. 8, a first metal layer 141 may be formed in and above the opening MP_O of the mask pattern MP. The first metal layer 141 may be formed by performing a first electroplating process such as direct current (DC) electroplating or pulse electroplating.

The first metal layer 141 may be formed of a metallic material from a surface of the metal seed layer 133, which surface is exposed to the opening MP_O of the mask pattern MP, and may partially fill the opening MP_O of the mask pattern MP. The first metal layer 141 formed from a floor of the opening MP_O may have a cylindrical pillar shape, a rectangular pillar shape, or a square pillar shape.

The first electroplating process may use a copper plating solution. The copper plating solution may be added with additives A1 and A2 that control a plating rate of the metallic material for each region in the opening MP_O of the mask pattern MP when the first electroplating process is performed.

For example, when a substrate is provided into an electrolyte solution containing copper ions ($Cu^{2+}$ or $Cu^+$), and when power is applied to a target (pure copper) serving as an anode and to the substrate serving as a cathode, copper ions ($Cu^{2+}$ or $Cu^+$) originating from the target may migrate through the electrolyte solution toward the substrate, which may result in the formation of the first metal layer 141 on the metal seed layer 133. An intensity of current for the first electroplating process may depend on a surface profile of the substrate where plating is performed.

When the first electroplating process is performed to form the first metal layer 141, the metallic material may grow from the surface of the metal seed layer 133, and there may be a difference in plating rate between in the opening 121 of the passivation layer 120 and in a location adjacent to an inner wall of the opening MP_O of the mask pattern MP.

For example, an electrolyte solution, an accelerator A1, and a suppressor A2 may be included in the copper plating solution that is used for the first electroplating process by which the first metal layer 141 is formed. The electrolyte solution may contain water-soluble copper salt, the accelerator A1 may accelerate a copper reduction reaction, and the suppressor A2 may locally suppress the copper reduction reaction at a site where charge density is high.

The accelerator A1 may include a material whose molecular weight is less than that of the suppressor A2, and the suppressor A2 may be electrically charged during an electroplating process. The accelerator A1 may include, for example, SPS (bis(3-sulfopropyl) disulfide), MPSA (3-mercapto-1-propanesulfonic acid), or DPS (3-N,N-dimethlyamonodithiocarbamoy-1-propanesulfonic acid). The suppressor A2 may include, for example, a polymer-based organic compound such as polyethylene glycol (PEG) or polyethylene glycol-polypropylene glycol (PEG-PPG) copolymer.

When the first electroplating process is performed, a variation in surface shape of the metal seed layer 133 may induce an increase in current density within the opening 121 of the passivation layer 120. In such cases, when the first electroplating process is performed, a current flow may be concentrated on a central region than on an edge region of the opening MP_O of the mask pattern MP, and as a result, the accelerator A1 having low molecular weight may be accumulated on the central region of the opening MP_O of the mask pattern MP. A plating rate of the first metal layer 141 may then be increased at the central region of the opening MP_O of the mask pattern MP. Therefore, the filing of the metallic material may begin at an inside of the opening 121 of the passivation layer 120.

When the first electroplating process is performed, current may be concentrated on a corner region between the top surface of the passivation layer 120 and the inner wall of the opening MP_O of the mask pattern MP, and accordingly, the suppressor A2 having electric charges and high molecular weight may be accumulated on the corner region of the opening MP_O of the mask pattern MP. The plating rate of the first metal layer 141 may then be reduced at the corner region of the opening MP_O of the mask pattern MP.

The accelerator A1 and the suppressor A2 may cause that the first metal layer 141 may be formed faster on the metal seed layer 133 in the opening 121 of the passivation layer 120 than on the metal seed layer 133 on the top surface of the passivation layer 120. In such cases, a thickness of the first metal layer 141 may be less on the top surface of the passivation layer 120 than in and above the opening 121 of the passivation layer 120. Therefore, a difference in level of a top surface of the first metal layer 141 may be less than a thickness of the passivation layer 120.

In the first electroplating process that forms the first metal layer 141, each of the accelerator A1 and the suppressor A2 may have different densities depending on regions in the opening MP_O of the mask pattern MP, and accordingly an average grain size of the first metal layer 141 may be changed depending on the regions in the opening MP_O of the mask pattern MP. For example, the average grain size of the first metal layer 141 may be reduced at a region (e.g., the edge region of the opening MP_O) where the suppressor A2 has a high density.

Figure 9:
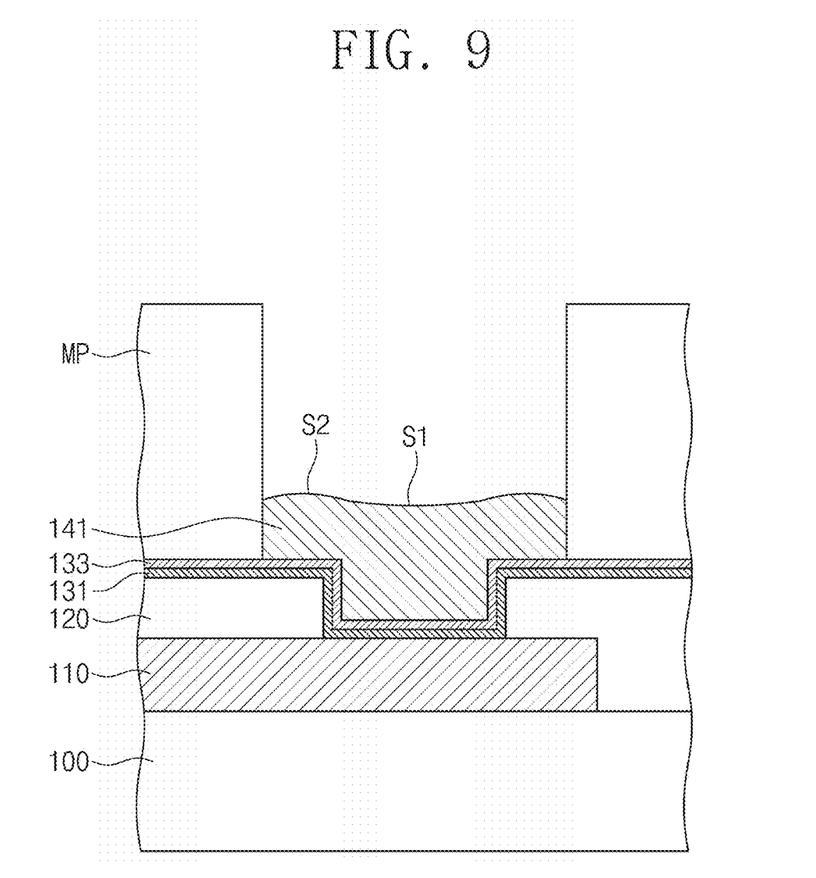

Referring to FIG. 9, the opening MP_O of the mask pattern MP may be partially filled with the first metal layer 141 formed by the first electroplating process, and the first metal layer 141 may have a top surface at a level higher than that of the top surface of the passivation layer 120. Because the suppressor A2 is concentrated on the corner region between the first metal layer 141 and the inner wall of the opening MP_O of the mask pattern MP, the first metal layer 141 may be upwardly convex on its top surface adjacent to the inner wall of the opening MP_O of the mask pattern MP. For example, as discussed above with reference to FIGS. 1A and 1B, the top surface of the first metal layer 141 may include a downwardly convex surface S1 and an upwardly convex surface S2.

As discussed above, an outer wall of the first metal layer 141 may contact the inner wall of the opening MP_O of the mask pattern MP, and may have a thickness less than that of the first metal layer 141 on the top surface of the passivation layer 120.

Figure 10:
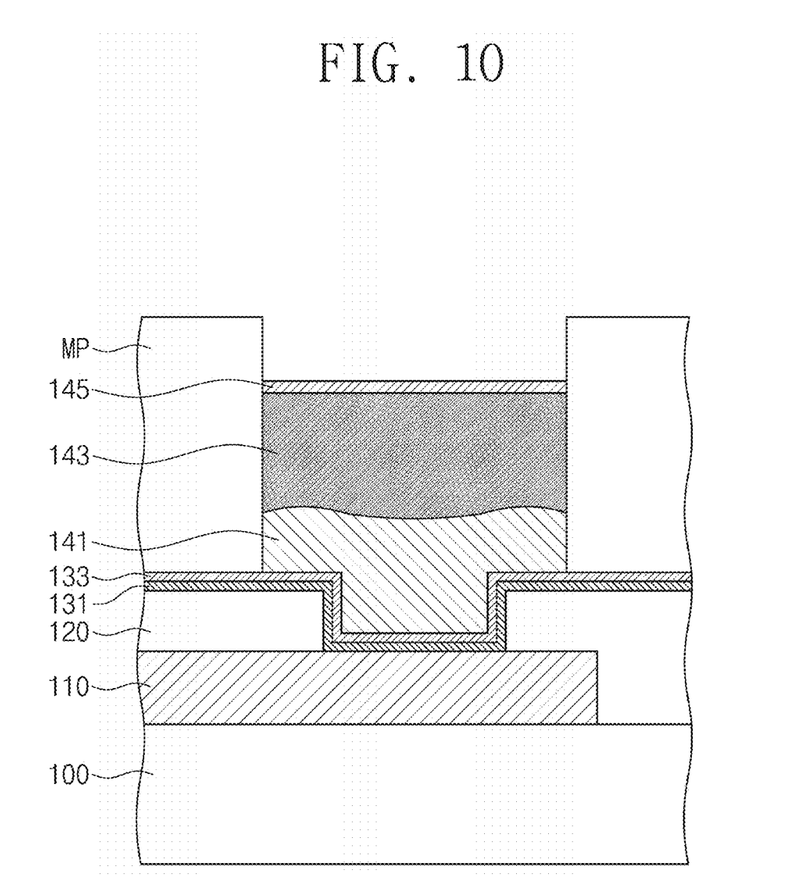

Referring to FIG. 10, a second electroplating process may be performed to form a second metal layer 143 on the first metal layer 141. Direct current (DC) electroplating or pulse electroplating may be employed as the second electroplating process, and a nickel plating solution may be used for the second electroplating process.

The filling of the second metal layer 143 may begin at the top surface of the first metal layer 141. Because the difference in level of the top surface of the first metal layer 141 is less than the thickness of the passivation layer 120, the second metal layer 143 may have a more planar top surface than the top surface of the first metal layer 141. The second metal layer 143 may have a thickness greater than that of the first metal layer 141.

Figure 11:
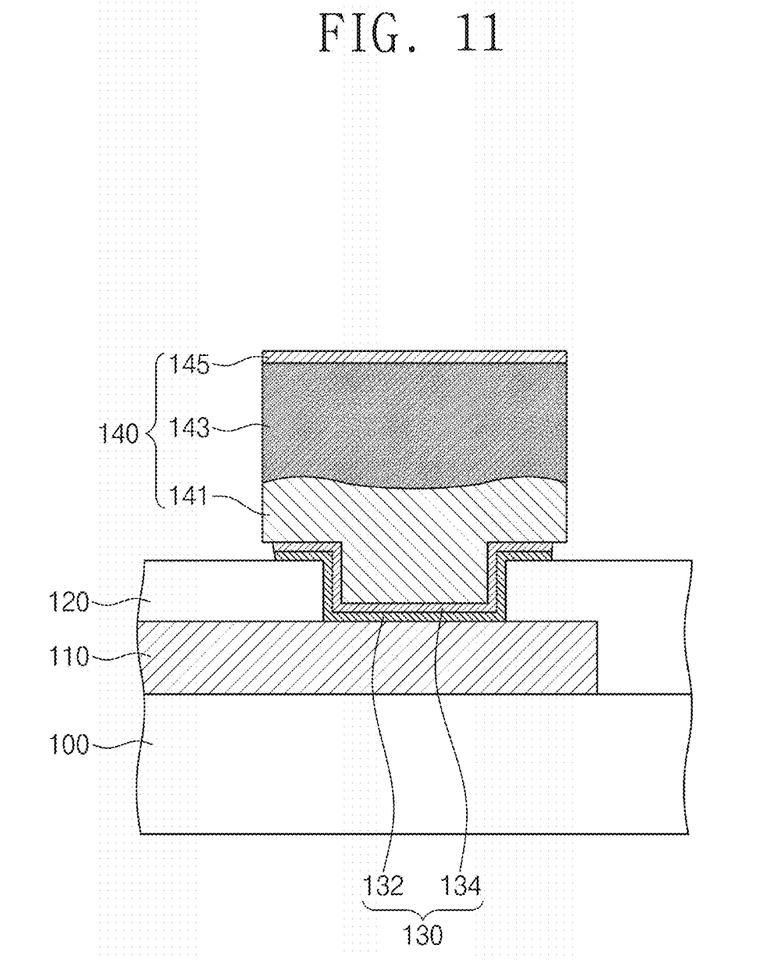

A third electroplating process may be performed to form a capping metal layer 145 on the second metal layer 143. After the capping metal layer 145 is formed, the mask pattern MP may be removed as shown in FIG. 11. When the mask pattern MP is formed of a photoresist layer, the mask pattern MP may be removed by a strip process that includes ashing and cleaning steps. The removal of the mask pattern MP may expose outer walls of the first, second, and capping metal layers 141, 143, and 145, and also expose the metal seed layer 133 under the mask pattern MP.

An etching process may be performed on the metal seed layer 133 and the metal barrier layer 131, and thus a metal seed pattern 134 and a metal barrier pattern 132 may be formed. When the metal seed layer 133 and the metal barrier layer 131 are etched, an undercut may be formed between the top surface of the passivation layer 120 and a bottom surface of the first metal layer 141.

According to some embodiments of the present inventive concepts, a pad structure electrically connected to an external electronic device may have a substantially planar top surface. It may then be possible to reduce the occurrence of impurities on a surface of the pad structure. Accordingly, when a semiconductor device is connected to an external device through solder balls or bumps attached on the surface of the pad structure, structural and electrical connection reliability may be improved between the semiconductor device and the external device.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A semiconductor device, comprising:
a conductive pattern on a substrate;
a passivation layer on the substrate and including an opening that partially exposes the conductive pattern;
a lower metal pattern connected to the conductive pattern, the lower metal pattern covering a sidewall of the opening; and
a first metal layer on the lower metal pattern, the first metal layer filling the opening of the passivation layer, the first metal layer having a first thickness at an outer wall of the first metal layer, a second thickness on a top surface of the passivation layer, and a third thickness on a top surface of the conductive pattern, the second thickness greater than the first thickness, and the third thickness greater than the second thickness,
wherein the outer wall of the first metal layer is misaligned with an outer wall of the lower metal pattern.

2. The semiconductor device of claim 1, wherein the lower metal pattern includes titanium, titanium nitride, tantalum, tantalum nitride, ruthenium, cobalt, manganese, tungsten nitride, nickel, or nickel boride.

3. The semiconductor device of claim 1, wherein the first metal layer includes copper (Cu) or a copper alloy.

4. The semiconductor device of claim 1, wherein the first metal layer includes a central part in and above the opening of the passivation layer and an edge part on the passivation layer, and
wherein the first metal layer has a thickness ranging from about 1.0 to 1.5 μm at the edge part and about 3.0 to 5.0 μm at the central part.

5. The semiconductor device of claim 1, wherein the lower metal pattern may have a substantially uniform thickness.

6. The semiconductor device of claim 1, further comprising a second metal layer on the first metal layer,
wherein the second metal layer has a non-planar bottom surface in contact with a top of the first metal layer and a planar top surface, and
wherein the second metal layer has a thickness greater than the third thickness.

7. The semiconductor device of claim 6, wherein the second metal layer has a thickness ranging from about 3.0 to 4.0 μm.

8. The semiconductor device of claim 6, wherein the second metal layer includes nickel (Ni).

9. The semiconductor device of claim 6, further comprising a capping metal layer on the second metal layer,
wherein the capping metal layer includes a second metallic material different from the first metallic material of the second metal layer.

10. The semiconductor device of claim 9, wherein the capping metal layer includes gold (Au).

11. A semiconductor device, comprising:
a conductive pattern on a substrate;
a passivation layer on the substrate and including an opening that partially exposes the conductive pattern;
a metal barrier pattern on the conductive pattern, the metal barrier pattern covering a sidewall of the opening; and
a pad structure in the opening of the passivation layer and connected to the conductive pattern, the pad structure including a first metal layer and a second metal layer on the first metal layer,
wherein the pad structure has an undercut defined by a top surface of the passivation layer, a bottom surface of the first metal layer, and an outer wall of the metal barrier pattern,
wherein the metal barrier pattern includes a first metallic material, and
wherein the pad structure includes a second metallic material different from the first metallic material of the metal barrier pattern.

12. The semiconductor device of claim 11, wherein the metal barrier pattern includes titanium, titanium nitride, tantalum, tantalum nitride, ruthenium, cobalt, manganese, tungsten nitride, nickel, or nickel boride.

13. The semiconductor device of claim 11, wherein the first metal layer includes copper (Cu) or a copper alloy.

14. The semiconductor device of claim 11, wherein the second metal layer includes nickel (Ni).

15. The semiconductor device of claim 11, wherein the first metal layer ha a width greater than a width of the opening.

16. The semiconductor device of claim 11, wherein the first metal layer includes a central part in and above the opening of the passivation layer and an edge part on the passivation layer, and
wherein the first metal layer has a thickness ranging from about 1.0 to 1.5 μm at the edge part and about 3.0 to 5.0 μm at the central part.

17. The semiconductor device of claim 11, wherein the second metal layer have a thickness ranging from about 3.0 to 4.0 μm.

18. A semiconductor device, comprising:
a conductive pattern on a substrate;
a passivation layer on the substrate and including an opening that partially exposes the conductive pattern; and
a metal barrier pattern connected to the conductive pattern, the metal barrier pattern covering a sidewall of the opening; and
a first metal layer on the metal barrier pattern, the first metal layer filling the opening of the passivation layer, the first metal layer including a central part in and above the opening of the passivation layer and an edge part on the passivation layer, a top surface of the first metal layer located at a level higher than a level of a top surface of the passivation layer, and the edge part of the first metal layer having an upwardly convex top surface, wherein the outer wall of the first metal layer is misaligned with an outer wall of the metal barrier pattern.

19. The semiconductor device of claim 18, wherein the first metal layer has a thickness ranging from about 1.0 to 1.5 μm at the edge part and about 3.0 to 5.0 μm at the central part.

20. The semiconductor device of claim 18, wherein the first metal layer includes copper (Cu) or a copper alloy, and wherein the second metal layer includes nickel (Ni).

* * * * *